(12) United States Patent
Chen

(10) Patent No.: US 9,959,185 B2
(45) Date of Patent: May 1, 2018

(54) MEMORY SYSTEM CAPABLE OF GENERATING NOTIFICATION SIGNALS

(71) Applicant: UNITED MICROELECTRONICS CORP., Hsin-Chu (TW)

(72) Inventor: Hsin-Wen Chen, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 127 days.

(21) Appl. No.: 15/140,492

(22) Filed: Apr. 28, 2016

(65) Prior Publication Data

US 2017/0315892 A1  Nov. 2, 2017

(51) Int. Cl.
*G06F 11/00* (2006.01)
*G06F 11/27* (2006.01)
*G06F 13/16* (2006.01)
*G06F 11/22* (2006.01)

(52) U.S. Cl.
CPC .......... *G06F 11/27* (2013.01); *G06F 11/2289* (2013.01); *G06F 13/1689* (2013.01)

(58) Field of Classification Search
CPC ... G06F 11/27; G06F 11/2289; G06F 11/1689
See application file for complete search history.

(56) References Cited

U.S. PATENT DOCUMENTS

| | | | | |
|---|---|---|---|---|
| 4,857,868 A * | 8/1989 | Robb | ........................ | H03K 3/03 327/291 |
| 6,347,056 B1 * | 2/2002 | Ledford | ................. | G11C 29/44 365/201 |
| 6,452,459 B1 * | 9/2002 | Chan | ..................... | G11C 29/028 324/617 |
| 6,611,477 B1 * | 8/2003 | Speyer | ................... | G01R 27/04 324/617 |
| 6,928,593 B1 * | 8/2005 | Halbert | ............ | G11C 29/12015 365/201 |
| 7,007,188 B1 * | 2/2006 | Tischler | .................... | G06F 1/08 713/501 |
| 7,093,176 B2 * | 8/2006 | Nicolaidis | .............. | G11C 29/16 714/30 |
| 7,213,185 B2 * | 5/2007 | Barone | .............. | G01R 31/3187 714/718 |
| 7,319,625 B2 * | 1/2008 | Chang | .................... | G11C 29/12 365/201 |

(Continued)

Primary Examiner — Bryce P Bonzo
Assistant Examiner — Jonathan D Gibson
(74) Attorney, Agent, or Firm — Winston Hsu

(57) ABSTRACT

A memory system includes a memory device, a switch device, and a built-in self-test circuit. The memory device is for storing data and toggling a notification signal whenever a read operation or a write operation is completed. The switch device has a first input terminal for receiving an external clock signal, a second input terminal coupled to the memory device for receiving the notification signal, a select terminal for receiving a selection signal, and an output terminal for outputting a memory clock signal to the memory device. The memory clock signal is one of the external clock signal and the notification signal. The built-in self-test circuit is for outputting a control signal required by the memory device to perform the read operation or the write operation and check whether the memory device functions normally.

18 Claims, 7 Drawing Sheets

(56) References Cited

U.S. PATENT DOCUMENTS

| | | | |
|---|---|---|---|
| 7,721,175 B2* | 5/2010 | Resnick | G11C 29/16 |
| | | | 714/718 |
| 8,516,317 B2 | 8/2013 | Nadeau-Dostie | |
| 8,842,480 B2* | 9/2014 | Ellis | G11C 8/08 |
| | | | 365/189.02 |
| 9,298,572 B2* | 3/2016 | Ahmed | G01R 31/3177 |
| 9,298,573 B2* | 3/2016 | Kobla | G06F 11/27 |
| 9,405,648 B2* | 8/2016 | Kang | G06F 11/27 |
| 2003/0037295 A1* | 2/2003 | Galzur | G11C 29/38 |
| | | | 714/719 |
| 2005/0190627 A1* | 9/2005 | Nakatake | H03L 7/08 |
| | | | 365/226 |
| 2008/0222464 A1* | 9/2008 | Gorman | G11C 29/40 |
| | | | 714/718 |
| 2009/0009206 A1* | 1/2009 | Jarboe, Jr. | G01R 31/31858 |
| | | | 324/750.3 |
| 2009/0089599 A1* | 4/2009 | Westwick | G06F 1/3203 |
| | | | 713/323 |
| 2016/0225465 A1* | 8/2016 | Qian | G11C 29/38 |

\* cited by examiner

MEMORY SYSTEM CAPABLE OF GENERATING NOTIFICATION SIGNALS

BACKGROUND OF THE INVENTION

1. Field of the Invention

This invention relates to a memory system, and more particularly, a memory system that is able to generate notification signals whenever an operation is completed.

2. Description of the Prior Art

To ensure reliability of memory devices, testing process is necessary before assembling memory devices to systems. However, before a memory device is assembled to the system, the testing process usually requires a test circuit for providing testing signals to the memory device and a clock generator for providing the clock signal required by the memory device. Since the size of a memory device can be rather small and the signal connections of the memory device can be very complicated, some of memory devices may include built-in test circuits, that is, the built-in self-test circuits, to simplify the manual efforts for signal connections.

However, an external clock generator such as a phase lock loop circuit for providing the clock signal may still be required. Since the phase lock loop circuit and the memory device are different types of devices, the extra phase lock loop circuit may require different manufacturing process from the manufacturing process of the memory macro of the memory device. Consequently, the manufacturing process can be complicated, the cost may be raised, and yield may be reduced.

Furthermore, when testing the highest frequency of the memory device, one has to adjust the clock generator gradually according to the condition of the memory device, and the memory speed limitation tested is bounded by the highest frequency of the clock generator. Therefore the testing process can be time consuming and inaccurate. How to test the memory device efficiently without adding complicated extra circuit has become an issue to be solved.

SUMMARY OF THE INVENTION

One embodiment of the present invention discloses a memory system. The memory system includes a memory device and a control device.

The memory device is for storing data and toggling a notification signal whenever a read operation or a write operation is completed. The control device is for receiving the notification signal and performing a corresponding operation according to the notification signal.

Another embodiment of the present invention discloses a memory system. The memory system includes a memory device, and a built-in self-test circuit.

The memory device is for performing read operations or write operations. The built-in self-test circuit is for outputting a control signal required by the memory device to perform the read operations or the write operations, receiving data outputted from the memory device, checking whether the memory device functions normally, and generating a notification signal according to the data.

Another embodiment of the present invention discloses a method for operating a memory system. The memory system includes a memory device, a switch device, and a built-in self-test circuit. The method includes triggering the memory device to perform a read operation or a write operation, generating a notification signal and the built-in self-test circuit checking whether the memory device functions normally once the memory device completes the read operation or the write operation, and triggering the memory device again to perform a following operation according to the notification signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
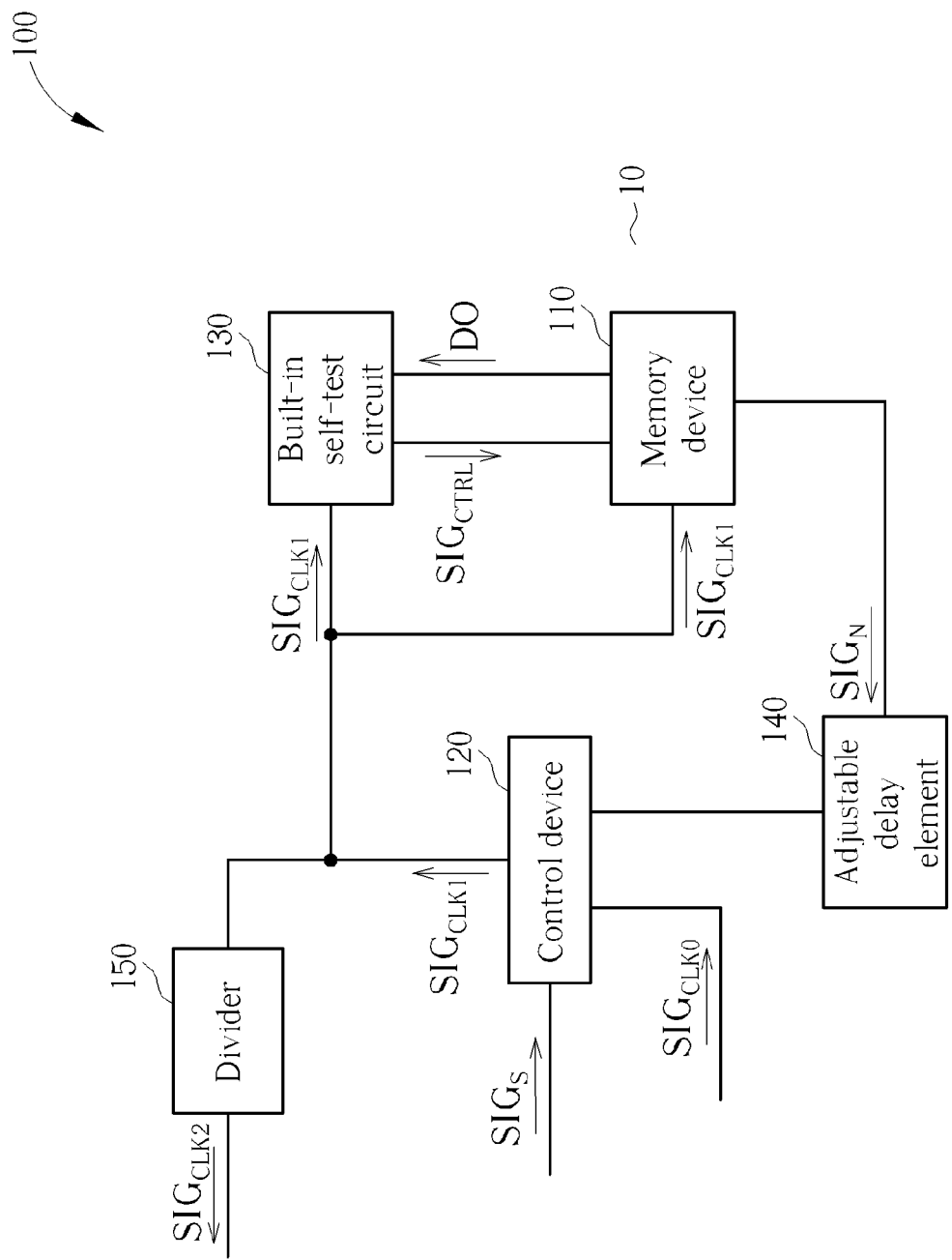
FIG. 1 shows a memory system according to one embodiment of the present invention.

FIG. 1 shows a memory system 100 according to one embodiment of the present invention. The memory system 100 includes a memory device 110, a control device 120, and a built-in test circuit 130.

The built-in self-test circuit 130 can output a control signal $SIG_{CTRL}$ required by the memory device 110 to perform the read operation or the write operation, and then the built-in self-test circuit 130 can check whether the memory device 110 functions normally. For example, the built-in self-test circuit 130 may control the memory device 110 to write some predetermined data by sending a control signal $SIG_{CTRL}$, the data and address to be written to the memory device 110, and control the memory device 110 to read the data. Once the built-in self-test circuit 130 receives the data DO outputted from the memory device 110, the built-in self-test circuit 130 may check whether the data outputted by the memory device 110 is the same as the predetermined data written previously.

The memory device 110 can store data and perform read operations or write operations according to the received control signal $SIG_{CTRL}$ and a memory clock signal $SIG_{CLK1}$. Also, whenever a read operation or a write operation is completed, the memory device 110 can toggle a notification signal $SIG_N$ so the system will be informed and move on to the following operation.

Figure 2:
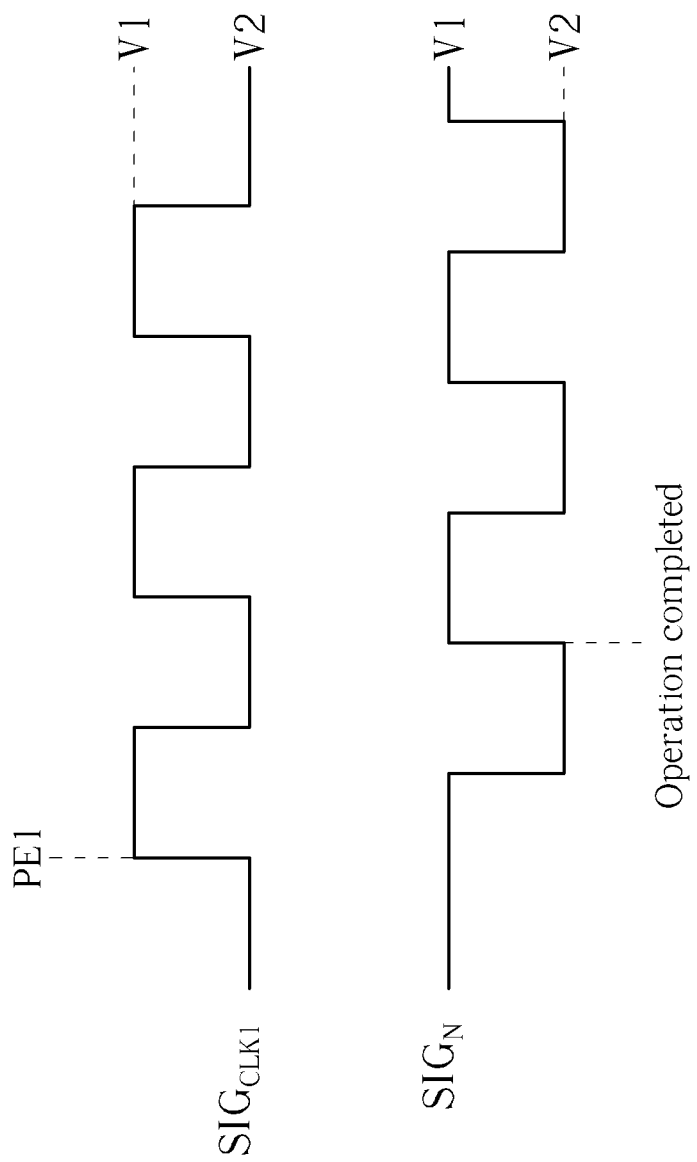
FIG. 2 shows waveforms of the notification signal and the memory clock signal according to one embodiment of the present invention.

FIG. 2 shows waveforms of the notification signal $SIG_N$ and the memory clock signal $SIG_{CLK1}$ according to one embodiment of the present invention. In FIG. 2, the notification signal $SIG_N$ remains at a high voltage level V1 when the memory device 110 does not perform any operations. After the memory device 110 is triggered by the positive edge PE1 of the memory clock signal $SIG_{CLK1}$, the memory device 110 may start to perform the operation according to the control signal $SIG_{CTRL}$ and pull down the voltage of the notification signal $SIG_N$ to a low voltage level V2 during processing. Once the memory device 110 completes the operation, the notification signal $SIG_N$ is raised to the high voltage level V1 again to inform the system.

In FIG. 2, the memory device 110 performs read and write operations continuously according to the memory clock signal $SIG_{CLK1}$ so the waveform of the notification signal $SIG_N$ includes consecutive pulses, which also behaves like a clock signal. Therefore, in some embodiments of the present invention, the notification signal $SIG_N$ can be redirected back to the memory device 110 as a clock signal to trigger the following operation of the memory device 110. Once the following operation is completed, the notification signal $SIG_N$ would be toggled again and be used to trigger a next operation of the memory device 110.

In FIG. 1, the control device 120 can output either an external clock signal $SIG_{CLK0}$ or the notification signal $SIG_N$ to the memory device 110 as a memory clock signal $SIG_{CLK1}$ according to the selection signal $SIG_S$. That is, the control device 120 may behave as a switch device. The control device 120 has a first input terminal for receiving the external clock signal $SIG_{CLK0}$, a second input terminal coupled to the memory device 110 for receiving the notification signal $SIG_N$, a select terminal for receiving the selection signal $SIG_S$, and an output terminal for outputting the memory clock signal $SIG_{CLK1}$ to the memory device 110. In some embodiments of the preset invention, the control device 120 can be implemented by a multiplexer, a NAND gate, or a combination of different logic elements.

The memory clock signal $SIG_{CLK1}$ can be one of the external clock signal $SIG_{CLK0}$ and the notification signal $SIG_N$. For example, when the memory device 110 is connected to an external system with the external clock signal $SIG_{CLK0}$ being available, the control device 120 can output the external clock signal $SIG_{CLK0}$ to the memory device 110 as the memory clock signal $SIG_{CLK1}$ so the memory device 110 would be synchronized with the external system.

However, when the memory device 110 is tested by the built-in self-test circuit 130 without external clock signal $SIG_{CLK0}$, the control device 120 can output the notification signal $SIG_N$ to the memory device 110 as the memory clock signal $SIG_{CLK1}$. Also, in this case, the built-in self-test circuit 130 may also receive the memory clock signal $SIG_{CLK1}$ so the control signal $SIG_{CTRL}$ outputted from the built-in self-test circuit 130 can be synchronized with the memory clock signal $SIG_{CLK1}$.

In some embodiments of the present invention, the memory system 100 may further include an adjustable delay element 140 in case the memory device 110 is not able to respond correctly by self triggering instantly. The adjustable delay element 140 is coupled between the memory device 110 and the control device 120. The adjustable delay element 140 can delay the notification signal $SIG_N$ outputted from the memory device 110. Also, the length of the delay produced by the adjustable delay element 140 can be adjusted according to the status of the memory device 110 so that the memory device 110 can be triggered by its notification signal $SIG_N$ and function normally.

Furthermore, when the memory device 110 is triggered by its own notification signal $SIG_N$, the memory device 110 can perform operations almost without any delays between operations. Therefore, in this case, the frequency of the memory clock signal $SIG_{CLK1}$ may be seen as the highest operation frequency of the memory device 110. Therefore, the memory system 100 is not only able to test the memory device 110 without complicate extra circuit, but is also able to test the highest frequency of the memory device 110 efficiently. Also, since the memory system 100 can test the memory device 110 without external clock signals, the memory system 100 does not require any phase lock loop circuits, which also simplifies the manufacturing process.

Also, the frequency of the memory clock signal $SIG_{CLK1}$ can be too high to be measured sometimes. In this case, the memory system 100 may further include a divider 150. The divider can generate a checking clock signal $SIG_{CLK2}$ according to the memory clock signal, and a frequency of the checking clock signal $SIG_{CLK2}$ is lower than the frequency of the memory clock signal $SIG_{CLK1}$. In FIG. 1, the divider 150 is coupled to the control device 120.

In FIG. 1, the control device 120 and the memory device 110 may be disposed separately in different hard-macros. However, in some other embodiments of the present invention, parts of the memory device 110, the control device 120, and the built-in self-test circuit 130 may be disposed in the same hard-macro according to the system requirement.

Figure 3:
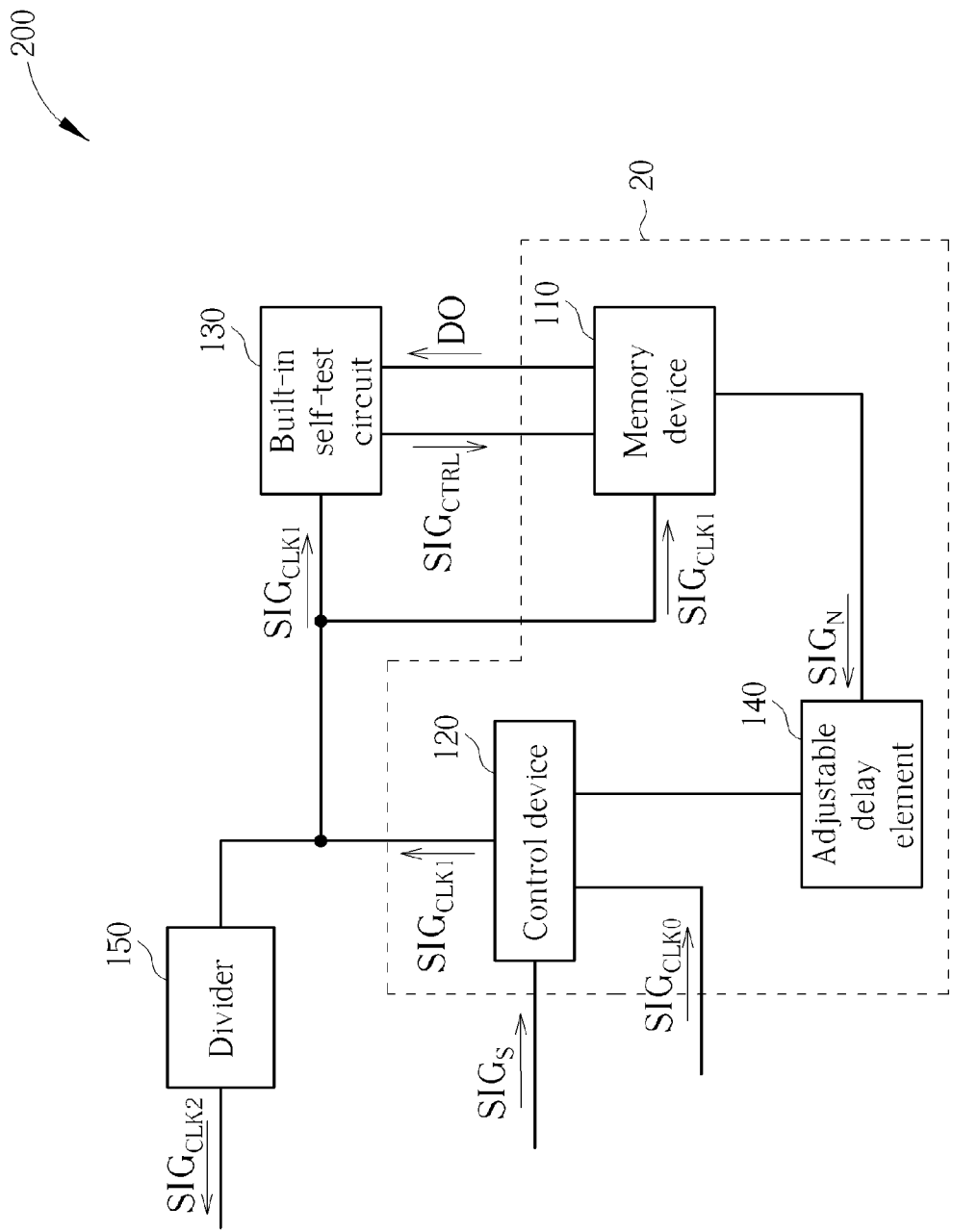
FIG. 3 shows a memory system according to another embodiment of the present invention.

FIG. 3 shows a memory system 200 according to one embodiment of the present invention. The memory system 200 and the memory system 100 have similar structures and operation principles. However, in the memory system 200, the control device 120, the memory device 110, and the adjustable delay element 140 are disposed in the same hard-macro 20.

Figure 4:
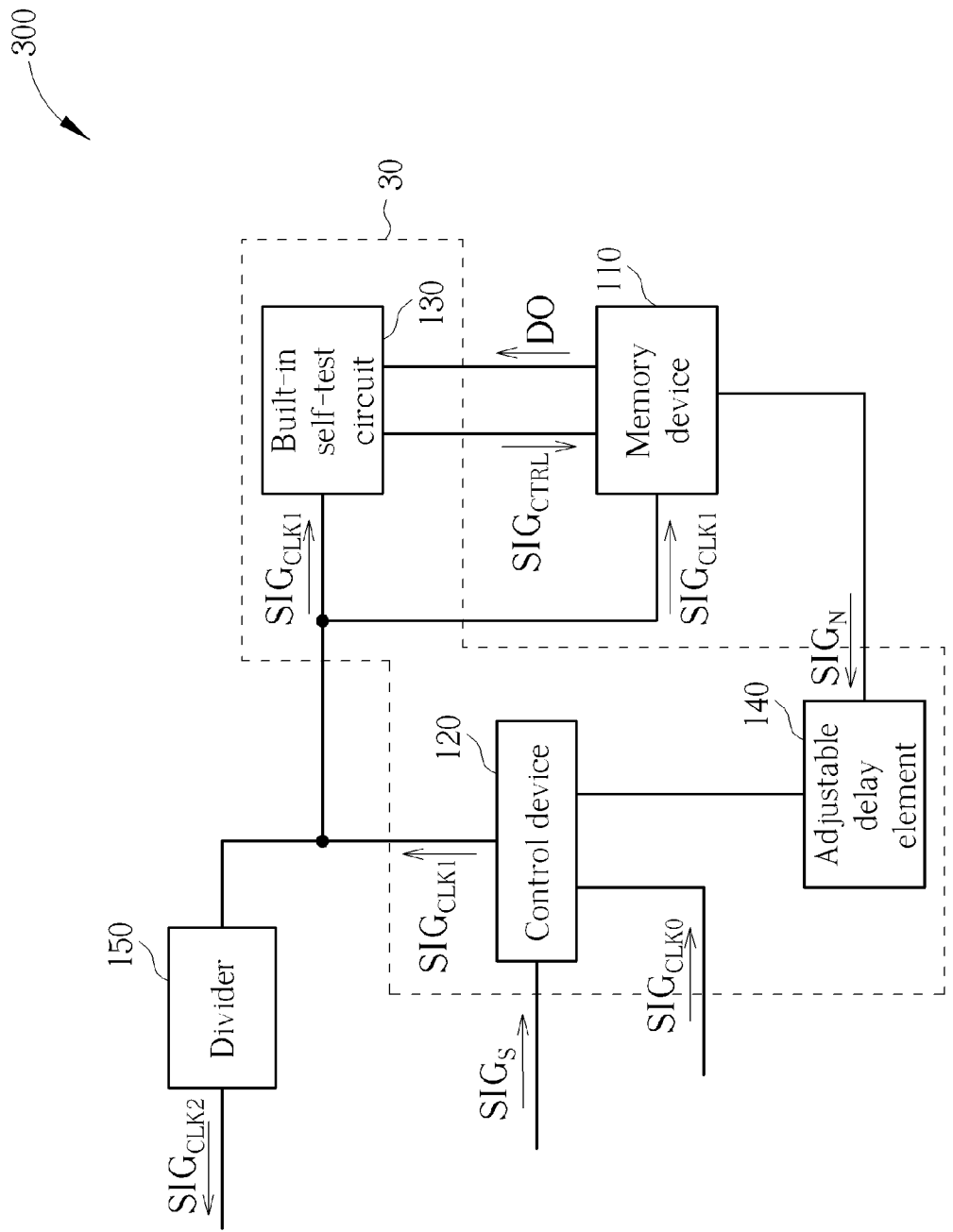
FIG. 4 shows a memory system according to another embodiment of the present invention.

In addition, FIG. 4 shows a memory system 300 according to one embodiment of the present invention. The memory system 300 and the memory system 100 have similar structures and operation principles. However, in the memory system 300, the switch device 120, the built-in self-test circuit 130, and the adjustable delay element 140 are disposed in the same hard-macro 30. In this case, the built-in self-test circuit 130 may receive the memory clock signal $SIG_{CLK1}$ directly from the switch device 120 without external wires.

In some embodiments of the present invention, the notification signal generated by the memory device may also be used by other kind of control device, and the control device may perform a corresponding operation according to the notification signal.

Figure 5:
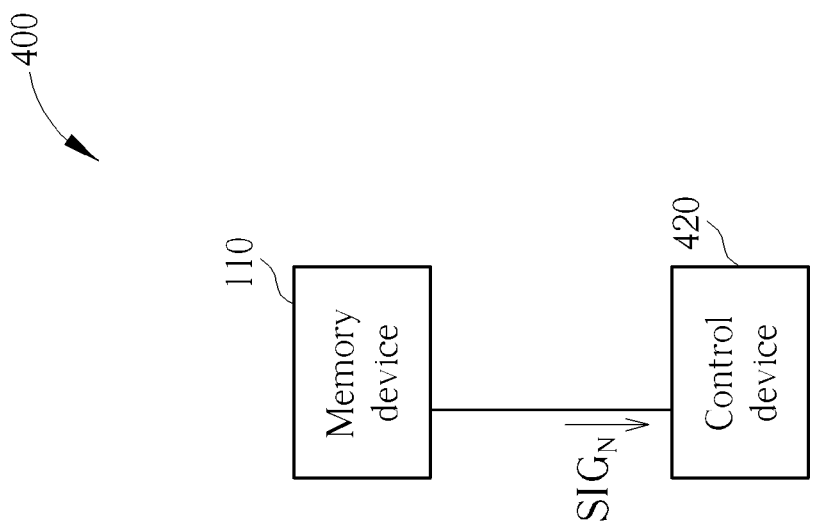
FIG. 5 shows a memory system according to another embodiment of the present invention.

FIG. 5 shows a memory system 400 according to one embodiment of the present invention. The memory system 400 includes a memory device 110 and a control device 420. The control device 420 can be a controller or a central processing unit of the memory system 400. Since the notification signal $SIG_N$ is toggled whenever an operation of the memory device 110 is completed, the control device 420, for example, is able to receive the read data from the memory device 110 or keep writing data to the memory device 110 without synchronizing with clock signals. Therefore, in some embodiments, once the control device 420 receives the notification signal $SIG_N$, the control device 420 may send the instructions to the memory to control the memory to perform a read operation or a write operation, or use the read data for further operation.

In some embodiments of the present invention, the memory device may not have the function to generate notification signal according to the operations. In this case, the built-in self-test circuit may be used to determine whether the operation is completed and to generate the notification signal according to the data received from the memory device.

Figure 6:
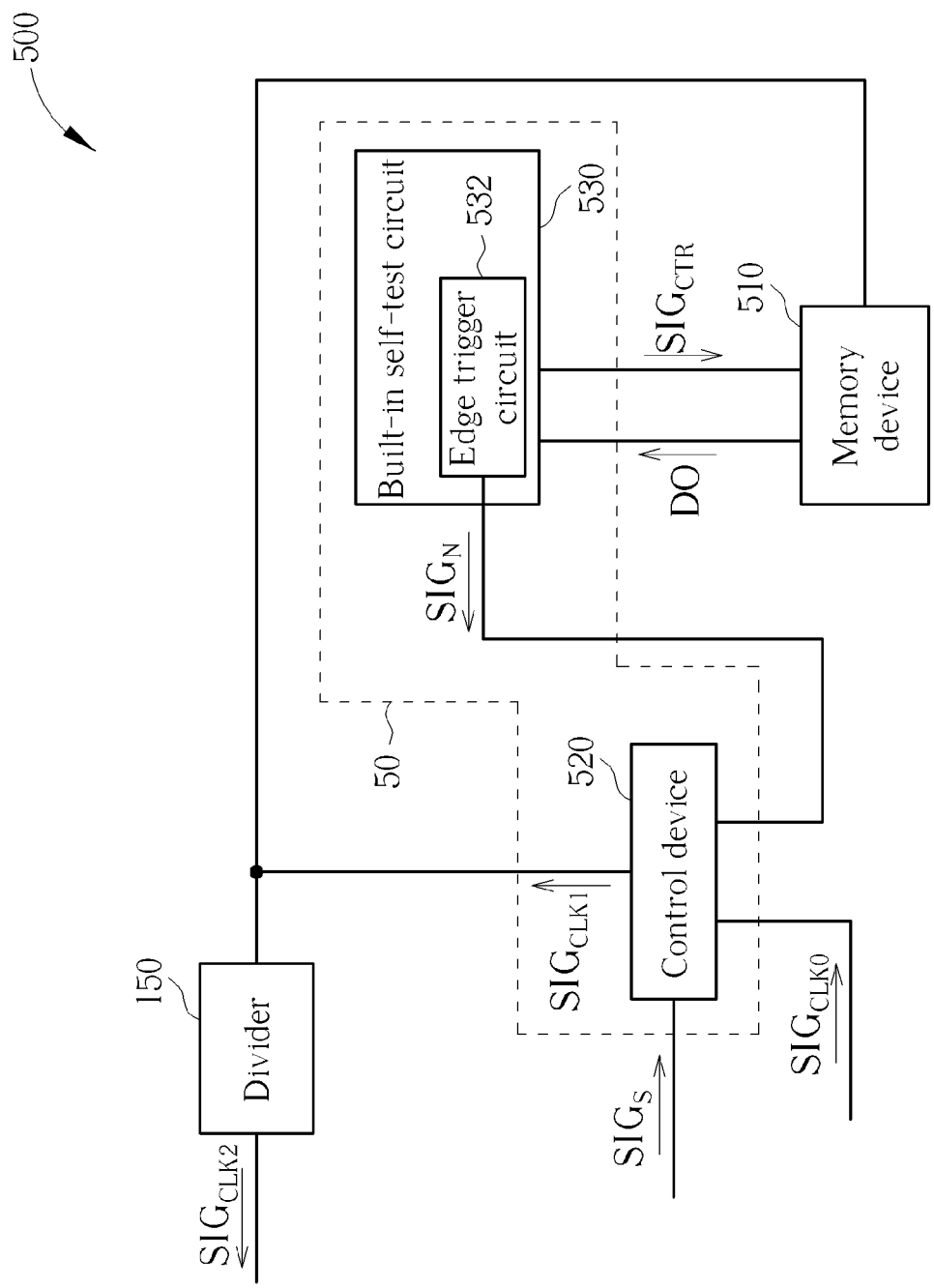
FIG. 6 shows a memory system according to another embodiment of the present invention.

FIG. 6 shows a memory system 500 according to one embodiment of the present invention. The memory system 500 includes a memory device 510, and a built-in self-test circuit 530.

The memory device 510 can perform read operations or write operations. The built-in self-test circuit 530 can output the control signal $SIG_{CTRL}$ required by the memory device 510 to perform the read operations or the write operations. Also, the built-in self-test circuit 530 can receive the data DO outputted from the memory device 510 and check whether the memory device 510 functions normally. Once the built-in self-test circuit 530 receives the data DO outputted from the memory device 510, the built-in self-test circuit 530 may toggle a notification signal $SIG_N$ to indicate the completion of the operation.

To ensure that the built-in self-test circuit 530 can identify the previous read data and the current read data outputted from the memory device 510, at least one specific bit of the data read from the memory device 510 may be designed to be toggled between a high bit level and a low bit level. That is, at least one bit of the previous data read from the memory device 510 and at least one bit of the current data read from the memory device 510 are at different bit levels, and at least one bit of the current data read from the memory device 510 and at least one bit of the next data read from the memory device 510 are at different bit levels. For example, if the least significant bit of the previous data read from the memory device 510 is a logic "1" at the high bit level, the least significant bit of the current data read from the memory device 510 may be a logic "0" at the low bit level, and the least significant bit of the next data read from the memory device 510 may be a logic "1" at the high bit level. In this case, by detecting the transition of the least significant bit of the data read from the memory device 510, the built-in self-test circuit 530 can easily identify whether the data outputted from the memory device 510 has been updated or not.

In FIG. 6, the built-in self-test circuit 530 includes an edge trigger circuit 532. Whenever the edge trigger circuit 532 detects a voltage transition of the data DO outputted from the memory device 510, the edge trigger circuit 532 may generate a pulse as the notification $SIG_N$. Consequently, the edge trigger circuit 532 can generate the notification $SIG_N$ according to the data outputted from the memory device 510, and the notification $SIG_N$ can be inputted to the memory device 510 as the memory clock signal $SIG_{CLK1}$.

Since the memory device 510 is triggered by the built-in self-test circuit 530 right after the operation is completed, the memory device 510 can perform operations almost without any delays between operations. Therefore, the frequency of the memory clock signal $SIG_{CLK1}$ may be seen as the highest operation frequency of the memory device 510. Consequently, the memory system 500 is not only able to test the memory device 510 without complicate extra circuit, but is also able to test the highest frequency of the memory device 510 efficiently. Also, since the memory system 500 can test the memory device 510 without external clock signals, the memory system 500 does not require any phase lock loop circuits, which also simplifies the manufacturing process.

In FIG. 6, the memory system 500 further includes a switch device 520 and the divider 150 so that the notification signal $SIG_N$ can be measured easier or can even be used by other devices. However, in some embodiments of the present invention, the divider 150 can be removed from the memory system 500 if the frequency of the memory clock signal $SIG_{CLK1}$ can be measured directly. In addition, the switch device 520 may be removed from the memory system 500. In this case, the notification signal $SIG_N$ can be sent to the memory device 510 directly from the built-in self-test circuit 530.

Also, in the memory system 500, the switch device 520 and the built-in self-test circuit 530 can be disposed in the same hard-macro 50. However, in some embodiments of the present invention, the switch device 520, the built-in self-test circuit 530, and the memory device 510 may all be disposed in the same hard-macro or different hard-macros.

Figure 7:
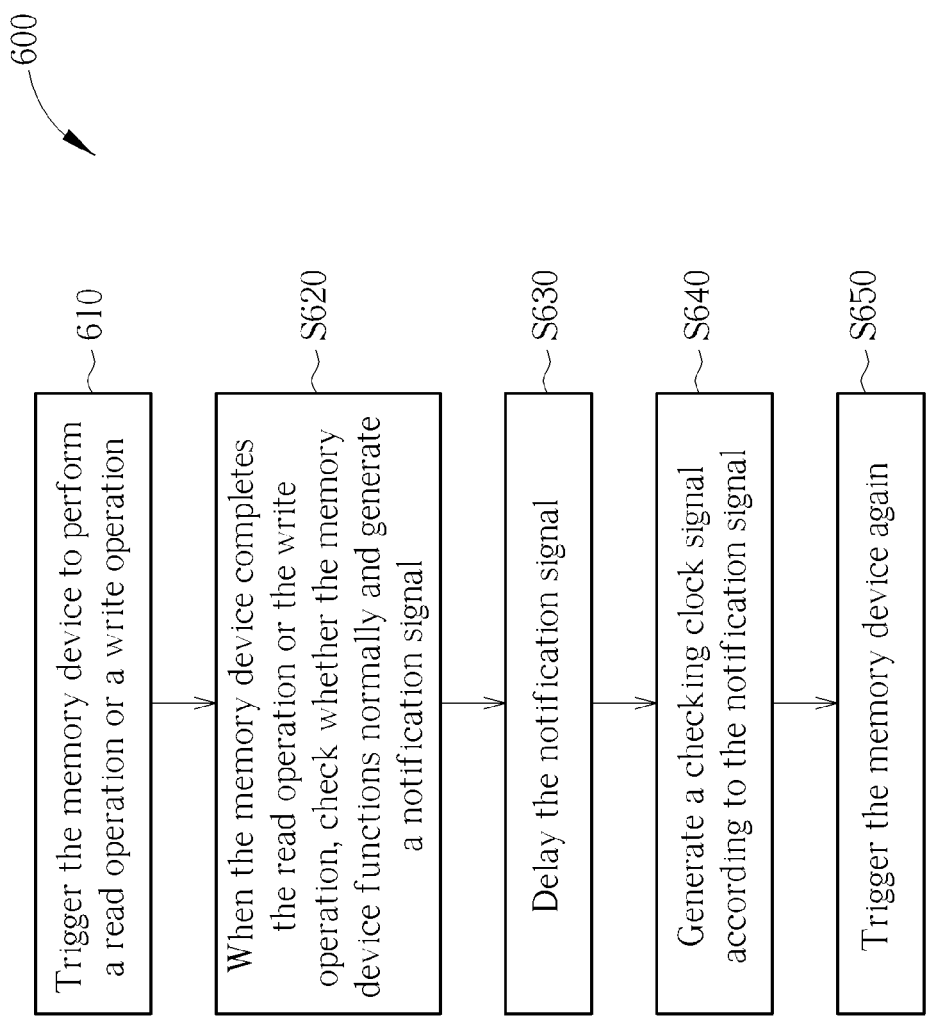
FIG. 7 shows a flow chart of a method for operating a memory system according to one embodiment of the present invention.

FIG. 7 shows a flow chart of a method 600 for operating a memory system according to one embodiment of the present invention. The method 600 includes, but is not limited to, steps S610 to S650.

S610: trigger the memory device to perform a read operation or a write operation;

S620: when the memory device has completed the read operation or the write operation, generate a notification signal and the built-in self-test circuit checks whether the memory device functions normally;

S630: delay the notification signal according to a status of the memory device;

S640: generate a checking clock signal according to the notification signal;

S650: trigger the memory device again to perform a following operation according to the notification signal.

In step S610, the memory device is triggered to perform the read operation or the write operation. If the read operation or the write operation has not been completed, the memory system may keep waiting. Once the memory device has completed the read operation or the write operation, the built-in self-test circuit would check whether the memory device functions normally and the notification signal would be generated in step S620.

In some embodiments of the present invention, the method 600 can be applied to the memory systems 100, 200, and 300. When operating the memory system 100, 200 or 300 with the method 600, the notification signal generated in step S620 can be generated by the memory device 100, 200 or 300 once the read operation or the write operation is completed. Also, in this case, the method 600 may further include a step for outputting the notification signal $SIG_N$ to the built-in self-test circuit 130 so the built-in self-test circuit 130 can output the control signal $SIG_{CTRL}$ required by the memory device 110 on the right timing to perform the following operation.

In some embodiments of the present invention, the method 600 can also be applied to the memory system 500. When operating the memory system 500 with the method 600, the notification signal generated in step S620 can be generated by the built-in self-test circuit 530 whenever the data read from the memory device 510 toggles between the high bit level and the low bit level.

In this case, the method 600 may further include a step for the built-in self-test circuit 530 to write test data to the memory device 510 before triggering the memory device 510 to perform read operations. That is, the built-in self-test circuit 530 can write the predetermined test data to the memory device 510 first, and to read the test data from the memory device 510 later. The predetermined test data can be specially designed so a plurality of bits consecutively read by the built-in self-test circuit 530 from the memory device 510 would be toggled between the high bit level and the low bit level when the memory device 510 is triggered to perform the read operations. For example, the least significant bits of the data read consecutively from the memory device 510 may have a sequence of "1", "0", "1", "0", "1" . . . and so on. In some embodiments of the present invention, this may also be done by arranging the reading order of data specially.

Consequently, by using the method 600 to operate the memory devices 100, 200, 300 and 500, the memory devices 110 and 510 can be tested efficiently without complicated extra circuit and external clock signals.

Furthermore, although in FIG. 7, the method 600 includes step S630 to delay the notification signal, it may not always necessarily be the case. For example, if the memory can function normally without any delays, step S630 may be skipped.

Also, in step S640, to measure the operation frequency of the memory device, a check clock signal with lower frequency is generated. Since the frequency of the checking clock signal is lower than the frequency of the notification signal, the measurement tool can measure the frequency easier. However, step S640 may be skipped if lowering the frequency is not necessary.

In summary, the memory systems and the methods for operating the memory systems provided by the embodiments of the present invention can test the memory devices efficiently without external clock signal. Therefore, the memory system may not require any phase lock loop circuit and the manufacturing process can be simplified. Also, the highest operation frequency can also be tested easily without complicate manual adjustments.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory system, comprising:
a memory device configured to store data and toggle a notification signal whenever a read operation or a write operation is completed; and
a control device configured to receive the notification signal and perform a corresponding operation according to the notification signal, the control device having a first input terminal configured to receive an external clock signal, a second input terminal coupled to the memory device for receiving the notification signal, a select terminal configured to receive a selection signal, and an output terminal configured to output a memory clock signal to the memory device;
wherein the memory clock signal is one of the external clock signal and the notification signal.

2. The memory system of claim 1, wherein the control device and the memory device are disposed in a same hard-macro.

3. The memory system of claim 1, further comprising:
a built-in self-test circuit configured to output a control signal required by the memory device to perform the read operation or the write operation and check whether the memory device functions normally.

4. The memory system of claim 3, wherein the control device and the built-in self-test circuit are disposed in a same hard-macro.

5. The memory system of claim 3, wherein the built-in self-test circuit is further configured to receive the memory clock signal to output the control signals.

6. The memory system of claim 1, further comprising a divider coupled to the control device and configured to generate a checking clock signal according to the memory clock signal, wherein a frequency of the checking clock signal is lower than a frequency of the memory clock signal.

7. The memory system of claim 1, further comprising an adjustable delay element coupled between the memory device and the control device, and configured to delay the notification signal outputted from the memory device.

8. The memory system of claim 1, wherein:
the control device is a controller configured to control the memory device to perform operations according to the notification signal.

9. A memory system, comprising:
a memory device configured to perform read operations or write operations; And
a built-in self-test circuit configured to output a control signal required by the memory device to perform the read operations or the write operations, receive data outputted from the memory device, check whether the memory device functions normally, and generate a notification signal according to the data, wherein the notification signal is toggled whenever a read operation or a write operation is completed; and
a switch device having a first input terminal configured to receive an external clock signal, a second input terminal configured to receive the notification signal, a select terminal configured to receive a selection signal, and an output terminal configured to output a memory clock signal to the memory device, wherein the memory clock signal is one of the external clock signal and the notification signal.

10. The memory system of claim 9, wherein the switch device and the built-in self-test circuit are disposed in a same hard-macro.

11. The memory system of claim 9, further comprising a divider coupled to the switch device and configured to generate a checking clock signal according to the memory clock signal, wherein a frequency of the checking clock signal is lower than a frequency of the memory clock signal.

12. The memory system of claim 9, wherein:
the built-in self-test circuit comprises an edge trigger circuit configured to generate the notification when the data outputted from the memory device toggles.

13. A method for operating a memory system, the memory system comprising a memory device and a built-in self-test circuit, the method comprising:
triggering the memory device to perform a read operation or a write operation;
once the memory device completes the read operation or the write operation:
the built-in self-test circuit checking whether the memory device functions normally; and
generating a notification signal; and
triggering the memory device again to perform a following operation according to the notification signal;
wherein the notification signal is a pulse used as a clock signal to trigger the memory device.

14. The method of claim 13, further comprising:
generating a checking clock signal according to the notification signal, wherein a frequency of the checking clock signal is lower than a frequency of the notification signal.

15. The method of claim 13, further comprising:
the built-in self-test circuit writing test data to the memory device before triggering the memory device to perform read operations;
wherein when the memory device is triggered to perform the read operations, a plurality of bits consecutively read by the built-in self-test circuit from the memory device are toggled between a high bit level and a low bit level.

16. The method of claim 15, wherein generating the notification signal is the built-in self-test circuit generating the notification signal whenever the test data read from the memory device toggles between the high bit level and the low bit level.

17. The method of claim 13, wherein:
generating the notification signal is the memory device generating the notification signal once the read operation or the write operation is completed;
the method further comprising:
outputting the notification signal to the built-in self-test circuit to output a control signal required by the memory device to perform the following operation.

18. The method of claim 13, further comprising:
delaying the notification signal according to a status of the memory device.

* * * * *